United States Patent [19]

Daniele et al.

[11] Patent Number: 4,868,422

[45] Date of Patent: Sep. 19, 1989

[54] TTL COMPATIBLE CMOS LOGIC CIRCUIT FOR DRIVING HEAVY CAPACITIVE LOADS AT HIGH SPEED

[75] Inventors: Vincenzo Daniele, Brugherio; Mirella Benedetti, Vimercate, both of Italy

[73] Assignee: SGS Microelettronica S.p.A., Catania, Italy

[21] Appl. No.: 130,815

[22] Filed: Dec. 9, 1987

[30] Foreign Application Priority Data

Dec. 10, 1986 [IT] Italy ................ 83668 A/86

[51] Int. Cl.$^4$ ........................................ H03K 19/003
[52] U.S. Cl. ................................. 307/451; 307/362; 307/443; 307/475
[58] Field of Search ............... 307/448, 451, 475, 362, 307/363, 579, 585, 264, 443

[56] References Cited

U.S. PATENT DOCUMENTS

| | | | |
|---|---|---|---|
| 4,486,670 | 12/1984 | Chan et al. | 307/475 X |
| 4,645,952 | 2/1987 | van Tran | 307/448 |
| 4,698,526 | 10/1987 | Allan | 307/475 |
| 4,703,199 | 10/1987 | Ely | 307/475 X |
| 4,728,827 | 3/1988 | Woo | 307/481 |

FOREIGN PATENT DOCUMENTS 0233929 11/1985 Japan ........................... 307/475

OTHER PUBLICATIONS

Hoffman, "Positive Voltage Translation Circuit", IBM T.D.B., vol. 17, No. 8, Jan. 1975, pp. 2392-2393.
Banker et al., "Receiver for Off-Module Mixed Technology Nets", IBM T.D.B., vol. 23, No. 6, Nov. 1980, pp. 2301-2302.

Primary Examiner—David Hudspeth
Attorney, Agent, or Firm—Pollock, Vande Sande & Priddy

[57] ABSTRACT

CMOS logic circuit with one or more inputs has at least a complementary pair of transistors, the N-channel driver transistor having a gate directly connected to an input while the P-channel load transistor having a gate connected to the output of the second one of two inverters connected in cascade, the input of the first inverter being connected to the input of the circuit. Using two signal inverting stages or inverters for mirroring the input signal on the gate of the load P-channel transistor of the circuit pair permits the defining of the triggering threshold of the circuit with great freedom, the obtaining of a greater switching speed and the reduction of power dissipation under stand-by conditions. The invention is particularly suited for HCT circuits.

4 Claims, 2 Drawing Sheets

TTL COMPATIBLE CMOS LOGIC CIRCUIT FOR DRIVING HEAVY CAPACITIVE LOADS AT HIGH SPEED

BACKGROUND OF THE INVENTION

1. Field of the Invention

The present invention relates, in general, to so-called micrologic circuits, that is, logic circuits made by the integrated circuit technique of "condensing" a large number of basic and complex logic functions (logic circuitry) in a single monolithically integrated semiconductor device, according to LSI (Large Scale Integration) or VLSI (Very Large Scale Integration) techniques. According to such techniques a large number of logic elements, as well as complex ones such as binary decades, shift-register, etc., may be implemented on a single chip.

In particular, the invention relates to CMOS logic circuits, i.e. integrated circuits made by the so-called complementary MOS (Metal Oxide Semiconductor) technology, utilizing P-channel and N-channel surface field effect transistors.

Such a "family" of micrologics (CMOS) represents already a great technological improvement with respect to circuits made with MOS transistors of a single polarity (P or N channel) because CMOS circuits have the great advantage of dissipating "power" only during transitions of internal and input and/or output electrical signals. In other words, if DC levels are applied to a CMOS circuit, the circuit, even though correctly supplied, shows a current absorption (defined as $I_{CC}$=quiescent supply current or rest current) equaling only to the leakage current of internal junctions of the reverse biased circuit. For SSI (Small Scale Integration) and MSI (Medium Scale Integration) CMOS circuits, i.e. with a total number of transistors which may reach about 500, the $I_{CC}$ current, under rest conditions, i.e. under static conditions of the signals applied to the inputs (with logic levels of 0 or 1 satisfying the limits of the logic levels $V_{IL}$ and $V_{IH}$) is in the order of $$I_{CC} 10^{-6} A = 1 \ \mu A$$

In more densely packed integrated CMOS circuits of modern LSI or VLSI technologies, such a value may even be reduced by two or three orders of magnitude at room temperature so that the stand-by current, or quiescent current, becomes only a few nanoamperes (nA). As can be easily appreciated, such a characteristic makes the CMOS micrologics extremely advantageous with respect to other families of micrologics and particularly with respect to the one which, because of its extraordinary high speed characteristics, has dominated the field of standard logics (basic logic functions constituting the glue logic or "binder" for aggregating over complex cards LSI or VLSI integrated micrologic devices): that is, the TTL family (Transistor-Transistor Logic). Such TTL micrologics have in fact the disadvantage of a quiescent current which may vary between a few hundred microampers ($\mu A$) to a few milliampers (mA).

2. Discussion of the Technical Problem and of the Prior Art

On the other hand, today many apparatuses and/or logic devices made by the CMOS technology are often designed so as to be interfaceable with the output of TTL logic gates. In these instances, the CMOS circuitry is also known as HCT micrologics (from High Speed CMOS, TTL Compatible). In these situations, the gate, i.e. the input stage of the HCT logic, must be capable of accepting and discriminating the worst output levels available from a TTL logic output gate, that is:

1 (TTL logic) equivalent to $V_{OHTTLmin} = 2.4$ V
0 (TTL logic) equivalent to $V_{OLTTLmax} = 0.4$ V
with a sufficient noise immunity, so that:
$V_{INHmin} = 2.0$ V and $V_{INLmax} = 0.8$ V.

Under these conditions, the triggering threshold voltage for which the input stage of the CMOS logic circuit is designed equals to:

$$\frac{2.0 + 0.8}{2} = 1.4 \text{ V}$$

Normally, such an interface input stage is formed by a pair of complementary push-pull transistors, connected between a supply node and ground, having their respective gates connected in common and constituting the input terminal. In such a configuration the P-channel transistor acts substantially as a load for the N-channel transistor (driver).

A substantially symmetric noise immunity characteristic both for the 0 state and for the 1 state can thus be obtained. However, a problem arises when (as often happens) the whole circuitry stops, i.e. goes in stand-by, on a 2.4 V input level (state 1). In this case, in fact, the input stage of the HCT logic circuit conducts current which is limited only by the sizes of the complementary transistor pairs forming the input stage.

Because HCT logic circuits must be particularly fast, in terms of speed, in order to be compatible with the TTL logic circuits with which they interface, the sizes of the input stage transistors cannot be excessively reduced. As a consequence, in order to maintain the necessary speed, the HCT type CMOS micrologics may show a quiescent current ($I_{CC}$) drainage in the order of 1-2 mA, thus losing completely the most important characteristic of CMOS micrologics.

Therefore, one of the technical problems of HCT type CMOS micrologics is that of compromising between high speed and low consumption under rest conditions.

Several solutions have been proposed for overcoming this problem. One of the proposals contemplates the formation of a diode in series with the P-channel transistor of the input stage-with the aim of reducing the quiescent current ($I_{CC}$) in the P-channel transistor which, being the element of the input stage subjected to a greater overdrive factor (with 2.4 V at the input), is obviously the critical element to control in order to reduce current drainage.

The second proposal contemplates the utilization of an additional mask for ion implantation in the fabrication process in order to raise the threshold voltage of the P-channel transistor of the input stage with respect to the typical threshold voltage of other integrated transistors. Such proposal does reduce the quiescent current; yet it also depresses the speed characteristics of the logic circuit as a result of the threshold voltage of the P-channel transistor of the input stage being raised.

Both of the known proposals, though allowing a reduction of the quiescent current, decisively reduce the speed of the circuit. Moreover, the second proposal requires an additional masking procedure and therefore is a complex and more costly fabrication process.

A similar problem is encountered when an interface stage must drive a relatively heavy load, such as in the case of a buffer. In this case the load may be of several picofarads (pF) thus requiring an appropriate sizing of the complementary transistor pair of the stage, in order to ensure a sufficient transition speed.

Many problems similar to those already mentioned, or similarly connected problems, are encountered in making multiple inputs CMOS logic circuits, such as for example NAND and NOR circuits and mixed AND-NOR and OR-NAND circuits, etc. In these instances, the primary problem is represented essentially by the necessity of ensuring good noise immunity on all inputs under the various possible configurations. Since this is difficult to obtain by simply refining the control of the triggering thresholds of the integrated devices during the design and fabrication stages, the problem is often overcome by interfacing all the inputs with an appropriate interface stage followed by a second stage for regenerating the phase of the signal i.e. by means of two inverting stages having a configuration similar to the input interface stage of HCT circuits.

Also, in these latter cases, the requirement of preserving a high speed of the circuit often overshadows that of a good discrimination of the triggering threshold under any configuration of the multiple inputs of the circuit.

SUMMARY OF THE INVENTION

A primary objective of the present invention is to provide an improved CMOS logic circuit which allows the optimization of the transition speed characteristics and those of current consumption and/or noise immunity in a variety of circuit situations.

It is a further objective of the invention to provide a TTL compatible, CMOS input stage of improved characteristics will respect to input stages of the prior art.

It is yet another objective of the invention to provide an interface output stage for driving relatively heavy loads at high speed and showing a relatively low input capacitance.

These objectives and advantages are obtained by the CMOS logic circuit of the present invention which contemplates driving the load element (the P-channel transistor) of an input or interface stage, formed by a pair of push-pull connected complementary MOS transistors, by means of two appropriate auxiliary inverters. The first of said two auxiliary inverters determines the value of the triggering threshold voltage of the circuit independently of the characteristics of the P-channel transistor of the input or interface stage, and moreover sees an extremely small load because the load is essentially constituted by the input capacitance of the second of said two auxiliary inverters, i.e. of the phase regeneration stage. In this way the pair of complementary transistors of the input or interface circuit may, in terms of relative sizes of the two transistors of the pair and of the relative values of the threshold voltages of the two transistors, satisfy the particular requirements of speed without an excessive current drainage under static (DC) conditions.

BRIEF DESCRIPTION OF THE DRAWINGS

The invention, its various aspects, advantages and applications will clearly emerge through the following detailed description of several preferred embodiments, disclosed for purely illustrative purposes, direct reference also to the annexed drawings, wherein.

DETAILED DESCRIPTION OF THE INVENTION

Figure 1:
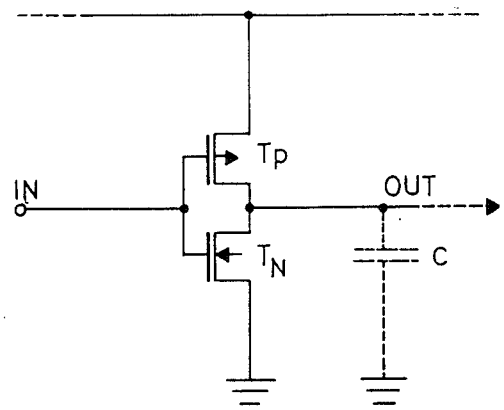
FIG. 1 is a circuit diagram of a typical input or interface CMOS stage.

FIG. 1 shows, for reference purposes, the circuit diagram of a typical CMOS inverter stage, which may be representative of an input stage of an HCT circuit or of the driver stage of a buffer, etc. When a stage of this kind has a certain preset load capacitance C, the only way to increase the switching speed of the stage consists in increasing the sizes of the two transistors $T_P$ and $T_N$ composing it. This type of design intervention causes an increase of the dynamic power dissipation and, if the stage in question is the input stage of an HCT circuit, also an increase of the static power dissipation as discussed in relation to the prior art.

Moreover, requirements of specific triggering voltages often impose an overdimensioning of the N-channel transistor. Therefore, according to the prior art, obtaining a high speed even in the presence of a relatively heavy capacitive load implies an increase of the sizes of the transistors and, as a consequence, of the power consumption.

Figure 2:
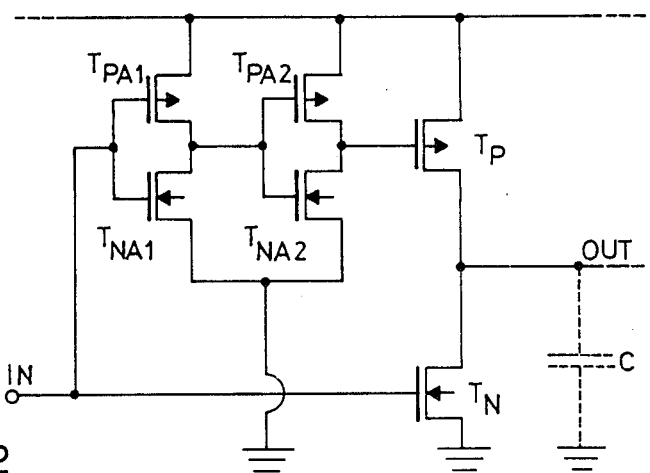
FIG. 2 is a circuit diagram of an equivalent stage of FIG. 1 modified in accordance with the present invention.
Figure 3:
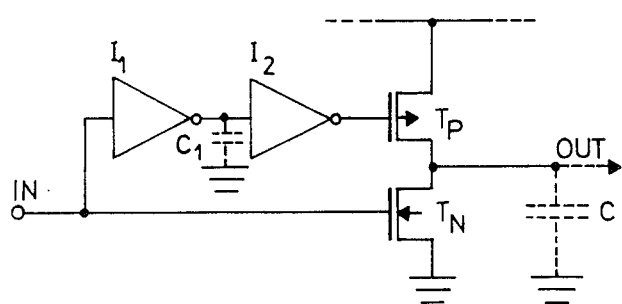
FIG. 3 is a principal diagram of the circuit of FIG. 2.

These limitations and disadvantages are overcome by modifying such a basic logic circuit in accordance with the present invention as shown in FIGS. 2 and 3.

As it may be observed, by means of two auxiliary inverters $I_1$ and $I_2$ the input signal is "mirrored" on the gate of the P-channel transistor of the circuit pair. Naturally, each auxiliary inverter may be formed by a pair of complementary transistors $T_{PA1}$, $T_{NA1}$ and $T_{PA2}$, $T_{NA2}$, respectively, as shown in the circuit of FIG. 2.

The triggering threshold of the circuit will be determined exclusively by the characteristics of the first auxiliary inverter $I_1$, the second auxiliary inverter $I_2$ providing regeneration of the phase of the signal. The dimensions of the two transistors $T_P$ and $T_N$ forming the functional pair of the circuit may then be increased freely as a function of the load capacitance C in order to permit a high switching speed without visibly increasing the current drainage under stand-by conditions. In fact, the auxiliary inverter stage $I_1$ may be easily sized as a function of a load capacitance $C_1$, which may advantageously be of an order of magnitude lower than the load capacitance C of the circuit. Therefore current drainage under stand-by conditions of the auxiliary inverter $I_1$ is extremely small.

In other words, the presence of the two auxiliary inverters $I_1$ and $I_2$ effects the "elimination" of the "load" (i.e. the P-channel transistor $T_P$) of the "driver" (i.e. the N-channel transistor $T_N$). This practically reduces to nil the power consumption under DC conditions. In fact, the P-channel transistor $T_P$, acting as a load element for the N-channel transistor $T_N$, turns-on during a transition from high to low of the input signal, thereby bringing the output from a low to a high level. In other words, dimensioning of such a P-channel transistor $T_P$ is no longer restrained from threshold voltage considerations.

Figure 4:
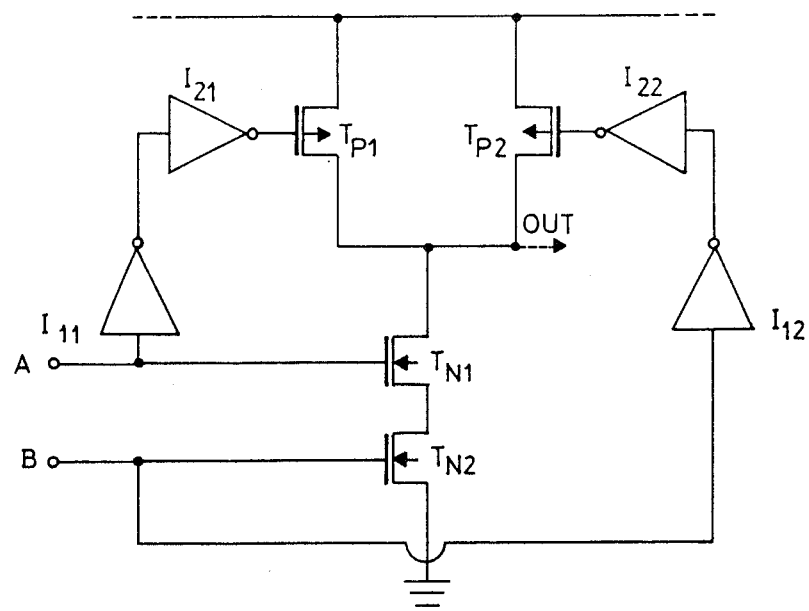
FIG. 4 shows a multi-input, NAND logic circuit made in accordance with the teachings of the present invention.
Figure 5:
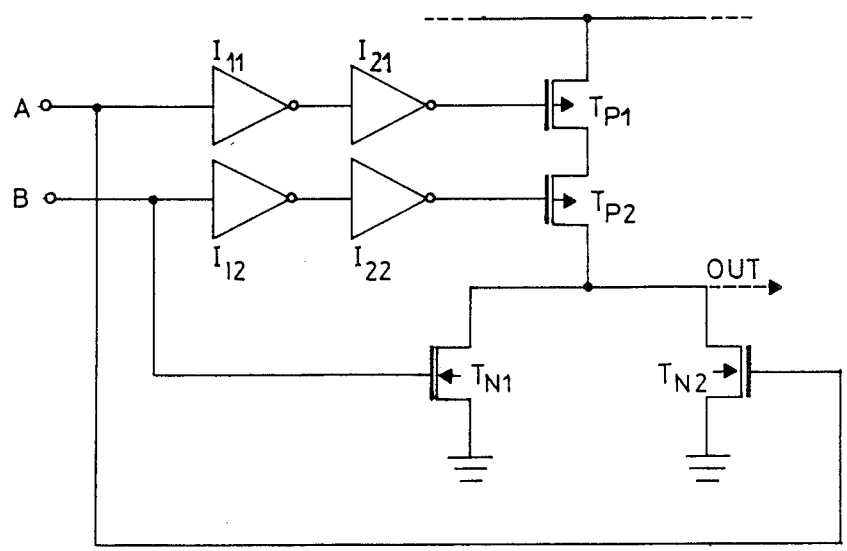
FIG. 5 shows a multi-input, NOR logic circuit made in accordance with the teachings of the present invention.

FIGS. 4 and 5 represent embodiments of multi-input CMOS logic circuits made in accordance with the present invention.

In the case of a NAND circuit (FIG. 4) as well as in the case of a NOR type circuit (FIG. 5), the inverters $I_{11}$ and $I_{12}$ define the triggering threshold of inputs A and B, respectively, of the depicted multi-input circuits, which threshold voltage is advantageously independent of the logic level configuration of the inputs.

The "load" of the NAND circuit is represented by the P-channel MOS transistors $T_{P1}$ and $T_{P2}$, driven, respectively, by the second of the two inverters, i.e. $I_{21}$ or $I_{22}$.

In the NAND circuit of FIG. 4, when the inputs switch from a "0" level to a "1" level, the drivers, i.e. the N-channel transistors $T_{N1}$ and $T_{N2}$ brings the output OUT to a low level. Limitations in the dimensioning of these driver transistors are set only by the characteristics of the external generator, which commonly has a low output impedance.

Conversely, when the inputs switch from a high "1" level to a low "0" level, after the signal propagation time through the auxiliary inverters pair ($I_{11}$, $I_{21}$ and $I_{12}$, $I_{22}$) has elapsed, the P-channel transistors $I_{P1}$ and $I_{P2}$ are switched on, bringing the output OUT to a high level. Of course, the propagation time through the auxiliary inverters may be designed to be extremely small. Dimensioning of these P-channel transistors will advantageously depend only from speed considerations as a function of the external load, no longer having an influence upon the value of the triggering threshold of the circuit.

Similar considerations may be made also in the case of the NOR type circuit of FIG. 5.

The circuit made according to the present invention offers remarkable advantages.

With respect to a more essential form of such logic circuits (e.g. NAND and NOR of FIGS. 4 and 5), the use of P-channel transistors as a load of the logic gate, driven respectively by a pair of inverters, permits the obtaining of a greater speed in case the structure must drive a relatively high load capacitance. Alternatively, for comparable speed performance, the circuit of the invention permits a greatly reduced current drain under DC conditions.

Therefore, in a generic CMOS logic circuit having one or more inputs formed by at least an N-channel transistor having a gate connected to an input, a source connected to a first common potential ($V_{SS}$) and a drain connected to an output node either directly or through one or more N-channel transistors, having their respective gates connected to as many inputs, their sources and drains connected according to series-parallel arrangements, and by at least a P-channel transistor having a source connected to a second common potential ($V_{DD}$) and a drain connected to said output node either directly or through one or more P-channel transistors, the source and drain terminals of which are connected according to series-parallel arrangements, the present invention contemplates connecting the gate of said P-channel transistor to the output of a second of two auxiliary inverters arranged in series, the first of which has the input connected to said input node of the circuit;

said first auxiliary inverter determining a triggering threshold voltage of the circuit independent from the characteristics of said P-channel transistor; and said second inverter regenerating the phase of a signal applied to the gate of said P-channel transistor.

In particular, according to an alternative embodiment of the invention, the second one of said two auxiliary inverters arranged in series, instead of being a simple inverter stage may also be a logic gate the output level of which does not depend only from the state of the input of the first of said two inverters (or phase inverting stages). For instance such a second inverting stage may be a monostable circuit or another logic circuit, whose output is connected to the gate of the "load" P-channel transistor of the logic circuit.

Also with respect to a common practice in HCT circuits, wherein, in order to permit a good input threshold discrimination, each input of the logic circuit is interfaced by means of two inverters, the present proposed solution of the instant inventors offers remarkable advantages. In fact, according to the known technique, interfacing each input by means of two inverters arranged in series implies an inevitable increase of the transfer time between the input and the output of the logic circuit, all other parameters being the same. Conversely, with the circuit of the invention a greater speed is obtained because the transition from a high level to a low level of the output of the logic circuit is driven directly by the external generator. In other words, the input load of the logic circuit is subdivided between the external generator and the second inverting stage (second inverter).

As it will be evident to the skilled technician, the circuit of the invention may be advantageously applied also to other types of multi-input logic circuits of the NOR and NAND type, such as mixed structures of the AND-NOR, OR-NAND, etc. types.

What we claim is:

1. A CMOS logic circuit comprising:
   at least one N-channel transistor having a gate connected to an input, a source connected to a first common potential ($V_{SS}$) and a drain connected, either directly or through one or more other N-channel transistors having their respective gates connected to a corresponding number of inputs, to an output node;
   and at least one P-channel transistor having a source connected to a second common potential ($V_{DD}$), a drain connected, either directly or through one or more P-channel transistors to said output node;
   wherein the gate of said P-channel transistor is connected to the output of the second of two cascade-connected auxiliary signal inverting stages, the first of which being an inverter which determines a triggering threshold voltage of the circuit and the second of which being a logic gate whose output level depends from the state of the output of said inverter;
   the input of said inverter being connected to said input node of the circuit; and
   the input of the second of said two auxiliary signal inverting stages being connected to the output of said inverter.

2. The circuit according to claim 1, wherein the circuit is a NAND circuit having said at least one P-channel transistor connected in parallel to at least another P-channel transistor and said at least one N-channel transistor series connected to another N-channel transistor and at least two other cascade-connected auxiliary inverting stages to form two sets of two cascade-connected auxiliary inverting stages, the input of each of the first of the two cascade-connected auxiliary inverting stages of said two sets of two cascade-connected auxiliary inverting stages being connected to a corresponding input and the gate of a corresponding one of the N-channel transistors, and the output of each of the second of the two cascade-connected auxiliary inverting stages of said two sets of two cascade-connected auxiliary inverting stages being connected to the gate of a corresponding one of the P-channel transistors.

3. The circuit according to claim 1, wherein the circuit is a NOR circuit having said at least one P-channel transistor connected in series to another P-channel transistor and said at least one N-channel transistor connected in parallel to another N-channel transistor and at least two other cascade-connected auxiliary inverting stages to form two sets of two cascade-connected auxiliary inverting stages, the input of each of the first of the two cascade-connected auxiliary inverting stages of said two sets of two cascade-connected auxiliary inverting stages being connected to a corresponding input and the gate of a corresponding one of the N-channel transistors, and the output of each of the second of the two cascade-connected auxiliary stages of said two sets of two cascade-connected auxilliary inverting stages being connected to the gate of a corresponding one of the series connected P-channel transistor.

4. A CMOS input stage comprising:
a CMOS inverting stage having an input terminal and an output terminal, formed by an N-channel transistor and a P-channel transistor with source-drain paths functionally connected in series between a positive voltage supply rail and ground;
said transistors being respectively dimensioned to sink and source current to said output terminal for driving at a high speed a capacitive load connected thereto, wherein
said N-channel transistor has a gate connected to said input terminal;
said P-channel transistor has a gate connected to an output of the second of two cascaded auxiliary CMOS inverters, the input of the first of said two cascaded auxiliary CMOS inverters being connected to said input terminal;
said auxiliary CMOS inverters being formed with transistors having substantially smaller dimensions than both said N-channel and P-channel transistors.

* * * * *